(12) United States Patent
Williams et al.

(10) Patent No.: US 9,941,433 B2
(45) Date of Patent: Apr. 10, 2018

(54) COMPOSITE QUANTUM-DOT MATERIALS FOR PHOTONIC DETECTORS

(71) Applicant: Vadient Optics, LLC., Beaverton, OR (US)

(72) Inventors: George Williams, Portland, OR (US); Andrew S. Huntington, Aloha, OR (US)

(73) Assignee: Vadient Optics, LLC, Beaverton, OR (US)

( * ) Notice: Subject to any disclaimer, the term of this patent is extended or adjusted under 35 U.S.C. 154(b) by 0 days.

(21) Appl. No.: 15/259,038

(22) Filed: Sep. 7, 2016

(65) Prior Publication Data

US 2017/0018669 A1  Jan. 19, 2017

Related U.S. Application Data

(63) Continuation-in-part of application No. 14/967,247, filed on Dec. 11, 2015, now Pat. No. 9,466,745.

(60) Provisional application No. 62/090,776, filed on Dec. 11, 2014.

(51) Int. Cl.

| | |
|---|---|
| *H01L 27/146* | (2006.01) |
| *H01L 31/0352* | (2006.01) |
| *H01L 31/02* | (2006.01) |
| *H01L 27/144* | (2006.01) |
| *H01L 31/0224* | (2006.01) |
| *H01L 31/18* | (2006.01) |
| *B82Y 40/00* | (2011.01) |
| *B82Y 20/00* | (2011.01) |

(52) U.S. Cl.
CPC .. *H01L 31/035263* (2013.01); *H01L 27/1446* (2013.01); *H01L 27/14601* (2013.01); *H01L 31/02019* (2013.01); *H01L 31/022466* (2013.01); *H01L 31/035218* (2013.01); *H01L 31/18* (2013.01); *H01L 31/1876* (2013.01); *B82Y 20/00* (2013.01); *B82Y 40/00* (2013.01); *Y10S 977/774* (2013.01); *Y10S 977/813* (2013.01); *Y10S 977/892* (2013.01); *Y10S 977/954* (2013.01)

(58) Field of Classification Search
CPC ............................. B82Y 20/00; B82Y 10/00
USPC ............ 257/443, E31.003, E21.461; 438/63; 977/742, 892, 954
See application file for complete search history.

(56) References Cited

U.S. PATENT DOCUMENTS

| | | | | |
|---|---|---|---|---|
| 6,710,366 B1* | 3/2004 | Lee | ......................... | B82Y 10/00 257/103 |
| 6,819,845 B2* | 11/2004 | Lee | ......................... | B82Y 10/00 257/E21.09 |
| 7,358,525 B2* | 4/2008 | Lee | ......................... | B82Y 10/00 257/13 |
| 2002/0081943 A1* | 6/2002 | Hendron | ................. | B24B 1/005 451/8 |
| 2005/0236556 A1* | 10/2005 | Sargent | .................. | B82Y 10/00 250/214.1 |

(Continued)

Primary Examiner — Jami M Valentine

(57) ABSTRACT

A composite quantum-dot photodetector comprising a substrate with a colloidally deposited thin film structure forming a photosensitive region, the thin film containing at least one type of a nanocrystal quantum-dot, whereby the nanocrystal quantum dots are spaced by ligands to form a lattice, and the lattice of the quantum dots has an infill material that forms an inorganic matrix that isolates the nanocrystal quantum dots from atmospheric exposure.

33 Claims, 10 Drawing Sheets

(56) References Cited

U.S. PATENT DOCUMENTS

| | | | |
|---|---|---|---|
| 2006/0266998 A1* | 11/2006 | Vega | B82Y 10/00 257/21 |
| 2007/0132052 A1* | 6/2007 | Sargent | B82Y 10/00 257/443 |
| 2009/0305452 A1* | 12/2009 | Sargent | B82Y 10/00 438/69 |
| 2010/0108984 A1* | 5/2010 | Cho | C09K 11/025 257/13 |
| 2011/0141537 A1* | 6/2011 | Iwasaki | G02B 26/105 359/223.1 |
| 2011/0146766 A1* | 6/2011 | Nozik | B82Y 20/00 136/255 |
| 2012/0121067 A1* | 5/2012 | Hayden | G01T 1/2018 378/62 |
| 2013/0092221 A1* | 4/2013 | De Moura Dias Mendes | H01L 31/035209 136/255 |
| 2014/0027711 A1* | 1/2014 | Breen | C09K 11/06 257/13 |
| 2014/0353579 A1* | 12/2014 | Greco | G01N 33/588 257/13 |
| 2015/0344776 A1* | 12/2015 | Bootman | C09K 11/025 252/301.36 |
| 2016/0049536 A1* | 2/2016 | Kim | H01L 31/035218 257/14 |

* cited by examiner

COMPOSITE QUANTUM-DOT MATERIALS FOR PHOTONIC DETECTORS

CROSS-REFERENCE TO RELATED APPLICATIONS

This application is a continuation-in-part of U.S. patent application Ser. No. 14/967,247 filed on Dec. 11, 2014 which claims benefit of U.S. provisional patent application No. 62/090,776 filed on Dec. 11, 2014.

GOVERNMENT INTEREST STATEMENT

This invention was made with government support under Contract H92222-12-P-0068 awarded by the United States Special Operations Command. The government has certain rights in the invention.

TECHNICAL FIELD OF THE DISCLOSURE

The present disclosure relates in general to photodetectors. This application relates in particular to methods of manufacturing composite quantum-dot photodetectors.

BACKGROUND DISCUSSION

CMOS silicon imagers are the dominant focal plane arrays for visible light imaging. CMOS silicon imagers are implemented in multitude of applications from security cameras to cell phones. Due to silicon's band gap, these imaging platforms are spectrally limited with primary applications in the human visible spectrum. As crystalline silicon is mostly transparent to light wavelengths longer than 1.1 µm, for the short wavelength infrared (SWIR), imagers use compound semiconductor materials including indium gallium arsenide (InGaAs), mercury cadmium telluride (HgCdTe), and germanium (Ge). These compound semiconductor materials demonstrate good image performance, but they do so at very high cost due to manufacturability and cost structure due to their incompatibility with commercial high volume CMOS silicon processes. This application relates to another approach.

SUMMARY OF THE DISCLOSURE

The present disclosure is directed to apparatus and methods of manufacturing composite pixelated quantum-dot photodetector arrays. One apparatus of the present disclosure includes a composite quantum-dot photodetector comprising a substrate with a colloidally deposited thin film structure forming a photosensitive region, the thin film containing at least one type of a nanocrystal quantum-dot, whereby the nanocrystal quantum dots are spaced by ligands to form a lattice, and the lattice of the quantum dots has an infill material that forms an inorganic matrix that isolates the nanocrystal quantum dots from atmospheric exposure. In one aspect, a method of manufacturing the aforementioned photodetector comprises the following steps; alternatively dipping a wafer, or other substrate, into a colloidal solution containing at least one type of a quantum dot, thereby forming a monolayer of the quantum dots and then dipping the substrate with the monolayer of the quantum dots into a ligand spacing solution to build a film of the quantum dots; and alternatively exposing the film of the quantum dots to a gas vapor and a metalorganic precursors material. Exposing the film to the vapor coats the film's accessible surfaces, reacting with the infill material. Exposing the film to the inorganic matrix material penetrates pores of the film and reacts with the film's accessible surfaces to form an inorganic matrix. The inorganic matrix isolates the quantum dots from atmospheric exposure, reducing the rate of local reaction to atmospheric oxygen, thereby stabilizing the electrical properties of the device and stabilize the local density of states on the quantum dot surface. Also, the infill semiconductor can provide a bandgap heterostructure interface to the quantum-dot, preserving local confinement of one or both of the charge carriers, or promoting preferable injection or extraction of holes or electrons, into or out of the infill, or promoting preferential tunneling or hopping transport between quantum-dots.

BRIEF DESCRIPTION OF THE DRAWINGS

The accompanying drawings, which are incorporated in and constitute a part of the specification, schematically illustrate preferred embodiments of the present disclosure, and together with the general description given above and the detailed description of preferred methods and embodiment given below, serve to explain principles of the present disclosure.

DETAILED DESCRIPTION

Figure 1:
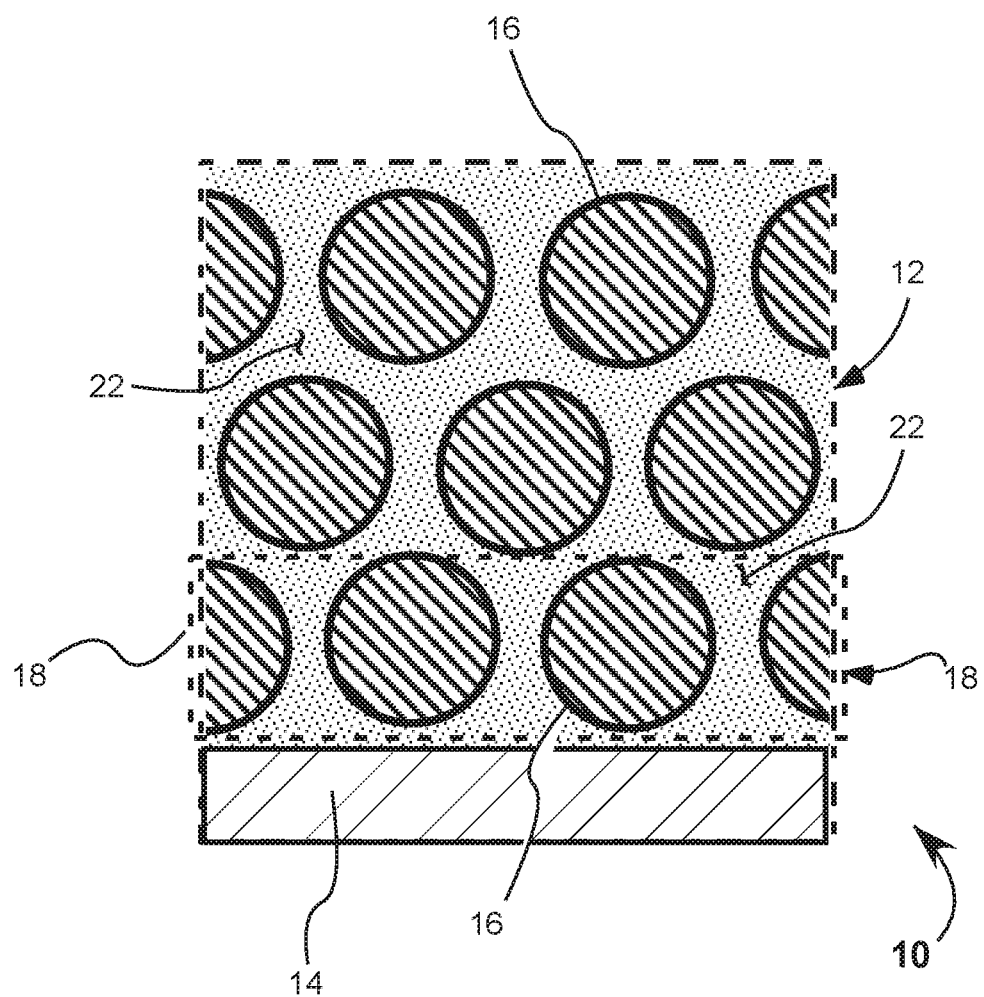
FIG. 1 is a partial cross-section view of a photodetector film made by alternatively dipping a substrate into a colloidal solution containing at least one type of a quantum dot, thereby forming a monolayer of the quantum dots and then dipping the substrate with the monolayer of the quantum dots in a ligand spacing solution to build a lattice of the quantum dots alternatively exposing the lattice of the quantum dots to a vapor and an infill material, wherein exposing the film to the vapor coats the lattice's accessible surfaces providing oxygen to the infill material for reaction and then exposing the lattice to the inorganic matrix material penetrates pores of the film and reacts with the film's accessible surfaces to form an inorganic matrix, the inorganic matrix being a photodetector film isolated the quantum dots from atmospheric exposure.

Referring now to the drawings, wherein like components are designated by like reference numerals. Methods of manufacture and various embodiments of the present disclosure are described further herein below.

Referring to FIG. 1, a partial view of a cross-section of a composite quantum-dot photodetector film 10 has a photodetector film 12 formed by a layer-by-layer deposition process to build homogenous and heterogeneous photodetector film on a substrate 14. One such process includes alternatively dipping the substrate 14 into a colloidal solution containing at least one type of a quantum dot 16, thereby forming a monolayer 18 of quantum dots 16 and then dipping the substrate with monolayer 18 of quantum dots 16 in a ligand spacing solution to build a lattice of the quantum dots. Then, alternatively exposing the lattice of the quantum dots to a water vapor and an infill materials leaves behind an inorganic material 22, wherein exposing the film to the water vapor coats the lattice's accessible surfaces providing oxygen reaction and then exposing the lattice to the inorganic matrix material penetrates pores of the lattice and reacts with accessible surfaces to form an inorganic matrix, thereby forming the photodetector film and isolating quantum dots 16 from atmospheric exposure.

The infilling process is typically performed within a reactor, wherein the accessible surfaces are exposed to a vapor or gas providing reactants to form the infill material. The excess precursor and volatile by products are purged via vacuum driven evaporation or chemical cleaning processes. The adsorbed layer of the first precursor reacts with the infill material, which can be organic or inorganic, where the reaction leaves behind the inorganic matrix material. The volatile byproducts and excess of the second precursor are likewise purged from the reactor to complete the process.

The process can be repeated to build the photodetector film using the same quantum-dot type, inorganic matrix material different materials, and combinations thereof. For instance, the colloidal solution can contain one or many quantum-dot types or the infill material can be changed. On repeated process the quantum-dot type or types, the inorganic-material, or combinations thereof can be changed to create different homogenous or heterogonous layers, thereby creating junctions with the photodetector film, including semiconductor heterojunctions and heterostructured devices including p+/n, p-i-n, n-B-n, and other such structures.

Figure 2A:
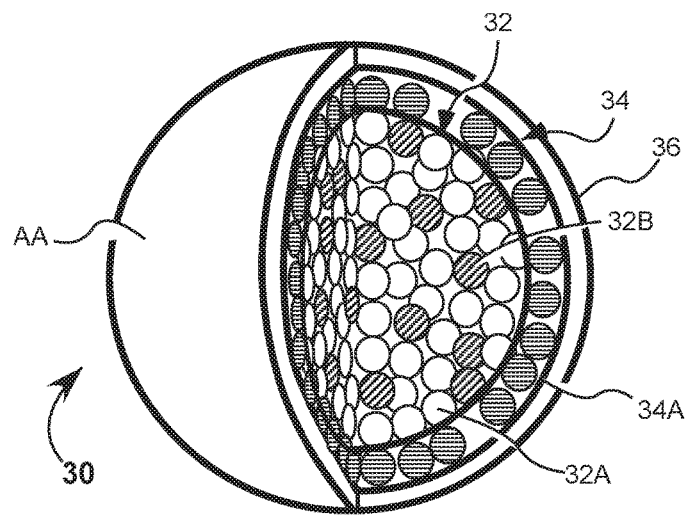
FIG. 2A is a perspective view, partly in cross-section of the quantum-dot configurations and structure.

Referring to FIG. 2A, a quantum-dot 30 is representative of the various configurations and tuning possible. The quantum-dots are nanometer-sized particles with quantum confinement in all dimensions with energy band structure discrete at atomic-like levels. As such the quantum-dot resembles an artificial tunable atom with electronic energies controlled by quantum-dot materials, shape, dimensions and material configuration. The extremely small size of the quantum-dots make "quantum confinement" effects dominate their electro-optical (EO) properties. When the quantum-dots diameter is smaller than the Bohr radius of an electron-hole pair, or exciton, created by photon absorption, the quantum-dot's energy state is discrete. The lowest energy optical transition increases as the particle size is reduced. Reduced quantum-dot size causes a blue-shift in the absorption and emission spectra. The greater the confinement, the shorter the wavelength of the electron, and the "bluer" the optical spectrum of the quantum-dot. The quantum-dots material type can include InSb, InGaP, PbS, PbSe, PbTe, $PbI_2$, HgS, HgTe, $LaF_3$, CdS, $CuInS_2$, $CuZnInS_2$, CdSe, $HfO_2$, CIS, CZTS, $YV(B)O_4$, ZnS, ZrO2, including core, core-shell, and core-shell-ligand architectures.

The quantum-dots are solution processed to allow convenient deposition onto the substrate. The fluidic processed quantum-dot's electro-optical properties are determined by their size, shape, and composition. Here, quantum-dot 30 has a core 32, a shell 34, and ligand coating 36. Core 32 can be configured to be atomically homogenous or an alloy, tunable by size and shape. Here, core 32 is circular with an alloy comprising a first atomic particle 32A and a second atomic particle 32B. Shell 34, also referred to in the art as a coating, can also be configured to be atomically homogenous or as an alloy, with shape approximately conforming to the core, dependent on the shell size or thickness. The shell can be tuned in relation to the core to modify electrical, optical, and electro-optical characteristics of the quantum-dot and chemical affinity to ligand coating 36 discussed further hereinbelow. Here, shell 34 comprises of an atomic particle 34A. Ligand coating 36 is an organic or inorganic material that coats the outside of the nanoparticle again, altering the electrical, chemical, and optical characteristics of the quantum-dot. Here the ligand coating is organic preventing aggregation when colloidally dispersed, although it can be replaced by an inorganic ligand coating upon deposition. The ligand defines in part the spacing of the monolayer of quantum-dots. In aggregate, the combination of the core, the shell, and the ligand are tunable and thus the photodetector film has tunable properties including a tunable band gap based on composition of the quantum-dots and infill material, allowing sensitivity to optical radiation including ultraviolet, visible, infrared, x-ray, and gamma photons.

The quantum-dots have a large surface-to-volume ratio. For perspective, nanoscale particles have approximately million times more surface area than a cm-scale object detector with the same volume. The quantum-dot's surface area and density of trap sites plays a significant role in the optoelectronic properties of the detector system. The quantum dot's large surface area and high surface energy causes particles, including the surrounding quantum-dots, to agglomerate and oxidize, which results in unstable performance and very short detector lifetimes. Typically, the as-synthesized quantum-dots include a long chain organic molecule, such as oleic acid, to prevent agglomeration and preserve quantum confinement properties during synthesis, storage, and subsequent deposition onto the substrate and films.

To allow quantum tuning of electronic states in the photodetector film and promote transport of one or both carriers from the quantum-dot into the inorganic matrix, alloy's of the quantum-dots can form type-II or quasi-type-II heterostructured quantum-dots. The type-II and quasi-type II heterostructured quantum-dots can form type-I or type-II heterostructures with the photodetector film. Delocalizing the hole and electron orbitals with consideration of the local dielectric environment the desired bandgap is achieved and the valence and conduction bands are aligned to allow transport of one carrier through the matrix and another carrier through dot-to-dot tunneling. To reduce carrier recombination, doping the quantum-dot or the infill material, optimizes bulk distributed heterostructure. Doping the quantum-dots and aligning the band structures, such that influence of the trap states can be controlled, allows high carrier lifetimes and large carrier mobilities.

Figure 2B:
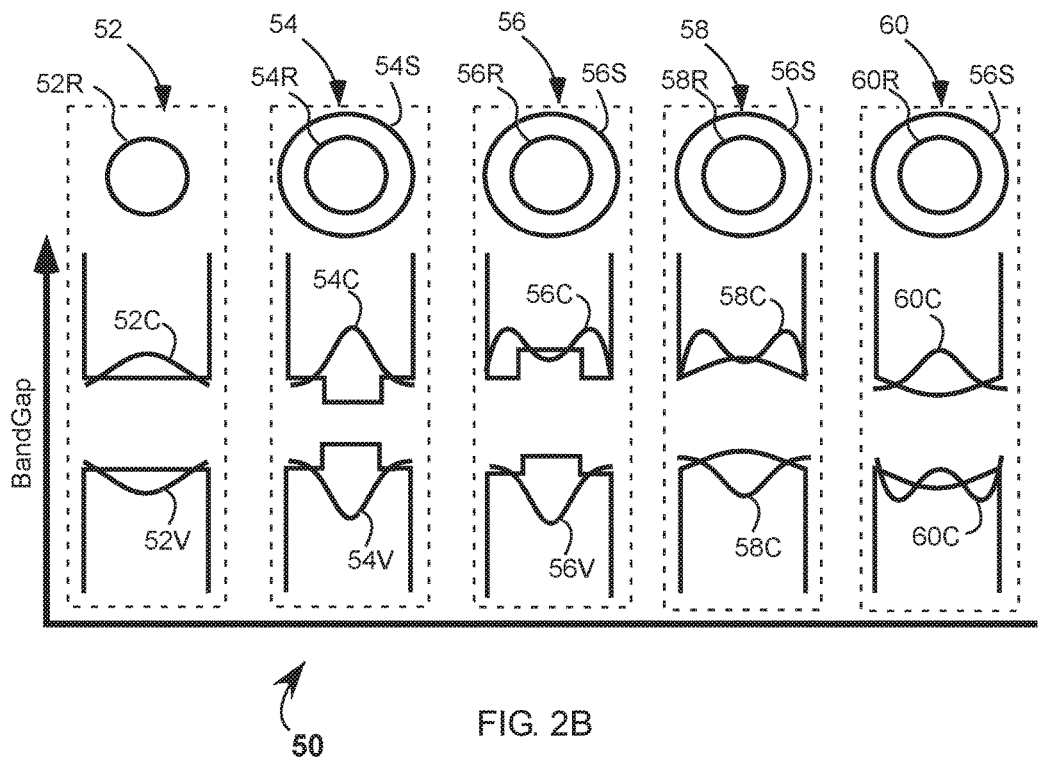
FIG. 2B is a cross-section view of the quantum-dots configurations and tunable electronic energies.

Referring to FIG. 2B, an energy band diagram 50 shows the components of the quantum-dots and accompanying conduction band and valence band. A simple core quantum-dot 52 is characterized by a core 52R with a conduction band 54C and a valence band 54V. A type-I core-shell quantum dot 54 has a core 54R and a shell 54S with a conduction band 54C and a valance band 54V. A type-II core-shell quantum dot 56 has a core 56R and a shell 56S with a conduction band 56C and a valance band 56V. A quasi type-IIA core-alloy quantum dot 58 has a core 58R and a shell 58S with a conduction band 58C and a valance band 58V. A quasi type-IIB core-alloy quantum dot 58 has a core 58R and a shell 58S with a conduction band 58C and a valance band 58V.

The aforementioned process include dipping the substrate into the ligand spacing solution. Replacing long fatty ligands, such as oleic acid suitable, with shorter length molecular linker to reduce the inter quantum-dot spacing. Using short-chain molecular linkers, such as EDT, reduces the inter quantum-dot spacing, lowering inter quantum-dot energy barriers that govern charge tunneling and resulting in higher conductivity.

As aforementioned, smaller linking molecule for the ligand coating make the quantum-dots more susceptible to agglomeration and precipitation. It is possible to avoid this problem by after deposition by swapping the longer molecule ligands with shorter organic or inorganic ligands, but shrinkage due to the reduction in bulk volume can lead to film cracking.

Using a layer-by-layer (lbl) deposition process, the long chain molecule capped as synthesized quantum-dots, is used to deposit the monolayer. The monolayer is "washed" with the ligand spacing solution containing the short chained organic or inorganic ligands replacing the "as synthesized" long-chain molecules by a short ligands, creating a highly uniform quantum-dot lattice with less internal stress.

The ligand spacing solution can include inorganic ligands that also passivate and dope the quantum-dots. The ligand spacing solution can include inorganic small molecules, including halides (I—, Br—, Cl—) and pseudohalides (N3-, OCN—, SCN—), metal-free chalcogenides, oxo- and amido species (S2-, HS—, Se2-, HSe—, Te2-, HTe—, TeS32-, OH—, NH2-), oxo- and polyoxo-metallates halometallates (such as CH3NH3PbI3), and chalcogenidometallates ($Sn_2S_6^{4-}$, $In_2Se_4^{2-}$, $Cu_7S_4^-$, or $AsS_3^3$, etc). These inorganic ligands passivate surface sites on the quantum-dots and increase the carrier mobilities of the photodetector film reaching up to 50 cm2/(V s), within two orders of magnitude of bulk semiconductor values. This enhancement in charge transport originates from significantly reduced inter quantum-dot distance and lowered energetic barrier between adjacent quantum-dots.

The process allows superlattice films containing more than one type of the quantum-dots. For example, a layer of one type of composition of the quantum-dot can be deposited, "washed" with solvents and a ligand spacing solution, then a second layer of different type of the quantum-dots can be deposited. The monolayer compositions can change as the quantum-dot lattice is grown. Several layers of one type of the quantum-dots can be deposited until a desired thickness is achieved, and then multiple layers of a second type of the quantum-dot can be deposited to a desired thickness. Heterostructured photodetector films, including p+/n, p-i-n, and other detector structures can be made, contacted with metal electrodes and operated as photon detectors. These layers can have preferential carrier transport, achieved through doping.

After depositing one or more of the monolayers of the quantum-dots and accompanying ligand replacement, the inter quantum-dot spacing is infilled with the inorganic material to form the inorganic matrix. The inorganic material can be oxide or semiconductor material, filling the spaces within the lattice. The infill can create or further promore type-I or type-II band alignment of the quantum-dots. The electrical and dielectric properties of the infill material can be used further quantum-tune the quantum-dot electronic states to form conduction and valence offsets favorable for preferential carrier extraction and transport. These offsets take into account the local nanoscale dielectric properties.

A nonlimiting list of the infill material includes chalcogenides ($As_2S_3$, PbS, PbSe), metal oxides ($Al_2O_3$ with trimethylammonium), methylammonium lead halides ($CH_3NH_3PbX_3$, where X is a halogen, such as iodine, bromine, or chlorine), with an optical bandgap between 1.5 and 2.3 eV depending on halide content; or formamidinium lead trihalide ($H_2NCHNH_2PbX_3$). Methylammonium lead halides and formamidinium lead trihalide allow charge transport in perovskites over long distances, with diffusion lengths of 1-2 μm at room temperature using solution-processing. The infill material leaves behind an inorganic material filling the lattice to form the inorganic matrix.

A large number of materials can be used to infill the lattice and form the inorganic matrix. Inorganic materials include oxides, sulfides, selenides, tellurides, nitrides, fluorides and some metals. Many classes of compounds are used as metal reactants. The metal reactants used in ALD can be roughly divided into two groups, inorganic and metal organic, and these can be further categorized into elements, halides, alkyls, cyclopentadienyls, alkoxides, b-diketonates, amides and imides, phosphines, silyls, and amidinates. Alkyls, which are organometallic reactants containing a direct metal-carbon bond, are generally very reactive, but stable alkyls are not available for many metals and the deposition temperatures are limited because of the decomposition of the reactants. Chlorides, which belong to the general class of halides, are reactive, stable at a broad temperature range and available for many metals, but the deposited films may suffer from chlorine residues and film thickness gradients in the direction of flow, formed by secondary reactions of the HCl released in the reactions. The variety in non-metal reactants is somewhat less than in metal reactants. The most commonly used types of non-metal reactants are the hydrides of the non-metal elements: water ($H_2O$), ammonia ($NH_3$—), and hydrogen sulphide ($H_2S$), to grow oxides, nitrides, and sulphides, respectively. The advantage of these types of reactants is their generally high stability and reactivity in a broad temperature range, including high temperatures.

The inorganic matrix infill materials can include oxides, sulfides fluorides or combinations thereof including $TiO_2$, $Al_2O_3$, MgO, $SiO_2$, $ZrO_2$, $Al_xZr_yO_z$, $In_2O_3$, $HfO_2$, ZnS, CaS, BaS, CdS, PbS, IN2S3, CuS, WS2, TiS2, Sb2S3, SnS, GaSx, GeS, MoS2, Li2S, Bi2S3, As2S3, ZnF, $LaF_3$. In sulfide growth, thiol ligands provide a reactive starting surface, analogous to hydroxyls in oxide ALD. The overall reaction can be written as $ML_x + (x/2)H_2S \rightarrow MS_{x/2} + xHL$, where $ML_x$ is the precursor of metal M with x ligands L.

The inorganic matrix acts isolates the quantum-dots from atmosphere suppressing oxidative and photo-thermal degradation. The process both negates the oxidation instability that is otherwise inherent quantum-dot based photodetectors and enhances the optoelectronic properties of the quantum dots. The inorganic matrix is the only component of the resulting composite that is accessible to the atmosphere. Because it is stable with respect to oxidation, the composite as a whole is stable with respect to oxidation.

In order to compliment the quantum dots with which it is paired, there are several constraints that the matrix material must satisfy to preserve confinement of both hole and electron orbitals and have suitable use as a photodetector film. It must have a wide band gap so that it does not absorb light in the region of interest. It must not have energy levels within the band gap of the quantum dots, so that it does not create trap states. It must have a vapor phase that can penetrate the quantum dot film at low temperatures, so as to allow for infilling without destroying the quantum dots. Finally, it must be stable and unaffected by oxygen exposure, so that it can protect the quantum dots from their environment.

Once the quantum-dot films have been encased in a suitable inorganic matrix, they are stable with respect to oxidation over period of years. The detectors subsequently made from these films exhibit steady, reproducible optoelectronic characteristics. Engineering the photodetector film must take into account the particular application and coulomb interactions between charges on the quantum-dots within the lattice.

Long-range coulomb interactions between charges on the quantum-dots slow the dynamics of injected electrons, an effect described by an electron (coulomb) glass model. To increase the electrical current through the photodetector film, the tunneling of electrons between quantum-dots must be enhanced. As introduced directly above, this can be achieved by decreasing the inter quantum-dot distance and height of the tunnel barriers between quantum-dots in the array. As inter quantum-dot distances are reduced using short inorganic ligands, changes in transport properties result from decreased separation and chemical transformation of the surface. As packing of the quantum-dots increases, the density of trap states can increase, preventing carriers in the photodetector films from obtaining the long carrier lifetimes required for high-performance detector operation. Instead of only considering the inter quantum-dot spacing, the applicants realize tuning the photodetector composition, the organic or inorganic ligand shells used to coat them, and the electrical properties of the infill materials enhance both hole and electron mobilities and lifetimes.

Doping generally refers to the large variety of techniques to perturb and control carrier concentrations in the photodetector films. The preservation of nanocrystal size and film morphology during these doping treatments ensures that the optical and transport properties are largely maintained.

The electronic states of a semiconductor can be characterized as either being donor or acceptor in nature. Donor states are electrostatically neutral when occupied by an electron and positively charged when empty [D(+/0)], while conversely, acceptor states are neutral when empty and negatively charged when occupied [A(0/−)]. Carrier concentrations and majority carrier type emerge from the requirement to balance all of the ionized donor and acceptor states within the system. At thermal equilibrium, a given donor/acceptor has an ionization probability determined by the Fermi-Dirac distribution. Thermal excitation of valence electrons over the energy barrier of the bandgap results in an intrinsic carrier concentration. The intrinsic carrier concentration specifies the balance, without external excitation, between electrons and holes via the law of mass action. This relationship also holds for nondegenerate extrinsically doped semiconductors, as any donor/acceptor states must also be in thermal equilibrium. Defect states can shift the balance of electrons and holes, but never change the p-n product in the nondegenerate regime. Defects can give rise to ionized dopant states. Native space charge can be compensated by doping comparable amounts of immobile charge of opposite polarity.

In heterovalent doping, impurities in a different valence state than the host cations are intentionally incorporated to provide either extra electrons (n-type) or extra holes (p-type). These carriers can introduce extrinsic conductivity to an otherwise poorly conducting material. The quantum dots can be doped n-type and p-type through the use of indium, tin, aluminum, silver, or other noble metal. In a nucleation-doping approach, the dopant and host precursors are mixed during the nucleation step. The reaction conditions and precursor reactivities are tuned so that the dopants nucleate first. The nuclei are then overcoated with a shell of the host material creating a core (dopant)/shell structure with a sharp or graded interface depending on the shell growth temperature. In the growth-doping approaches are available where a dopant precursors is added to quantum-dot to adsorb dopants at the quantum-dot surfaces. The dopant ions are then encapsulated by overgrowing an isocrystalline or heterocrystalline shell. A balance of reactivity is achieved when the dopant atoms remain on the quantum-dot's surface for a long enough time to undergo a precipitation reaction and to become "trapped" by host overgrowth.

One way to balance host and dopant precursor reactivity is to choose the appropriate coordinating ligand to the metal cations depending on the intrinsic reactivity dictated by their relative Lewis acidity. These considerations relate directly to the thermodynamic stability of metal-ligand bonds, but they have implications also for kinetic reactivity (i.e., rates of precipitation reactions). This connection can be appreciated by remembering that transition state theory can be used to predict changes in energetic reaction barriers due to variations in the free energy of the reactants. In some cases rather different Lewis acidities can be overcome without requiring different coordinating ligands on the host and dopant precursors.

The quantum-dots have high surface area to volume ratios, exposing a myriad of surface defects that can produce midgap defect states. Strong affinity between cations and nucleophilic ligands during synthesis leads to quantum-dots with nonstoichiometric cores that are charge balanced by a ligand shell. Despite being nonstoichiometric, natively synthesized quantum-dots are not heavily doped because the excess charge of the surface cations is compensated by their binding ligands. Synthetically modifying the stoichiometry of nanocrystals is often difficult, as changing precursor concentrations can result in different sized particles instead of stoichiometric variations.

Doping of the effective medium originates from nonstoichiometry, ligands and unpassivated surface sites, which shift the balance of space charge within the film and generate free carriers. Simultaneously, many of the free carriers are likely localized to traps of similar chemical origin, possibly due to self-compensation, and the Fermi level is often pinned. Despite this, a broad range of electrochemical potential shifts can be induced in native films through methods based on stoichiometric control, metal ion incorporation, and electrochemical charging.

When native ligands are removed as part of a ligand exchange, a variety of midgap states can form and cause doping or carrier trapping depending on their depth and donor/ acceptor type. In addition to exposing unpassivated surface sites, the choice of ligand also crucially determines the protection of surfaces from oxidation. Ligands can also play an active role in doping the photodetector films, either through modulating defect depths and densities, or through acting as charge donors themselves.

Since nonstoichiometry and charge balance are often the origin of native doping in nanocrystal films, using postsynthetic techniques to control the stoichiometry of a film is a logical tactic to control its doping. The overall doping effect of a given treatment can be understood by considering the average charge balance of all the atomic and molecular constituents of a film Doping through ion diffusion case is growth doping wherein the dopants are introduced in a preformed quantum-dot through diffusion. Cation exchange reactions, in which the cation of an ionic solid can be exchanged with a different cation, have been widely employed in semiconductor quantum-dot. In bulk semiconductor material the phenomenon can require weeks and require elevated temperature, the exchange in the quantum-dots can be done within seconds and at room temperature. The extent of the cation exchange reactions can be controlled by changing the solution concentration of incoming cations or the ligands that coordinate the ions in solution to modulate the contribution of ion solvation in the overall energetic balance of the reaction. In the nanosize regime "surface adsorption" of dopant ions can be followed by "lattice incorporation" above a certain critical temperature, also "lattice diffusion" and eventually "lattice ejection" of the dopants can occur upon thermal treatment.

Chemical redox agents, solubilized molecular species with known reduction potentials, can efficiently inject charge into the photodetector film. These approaches result in high doping densities as the reactions are only stoichiometrically or kinetically restrained.

As aforementioned the photodetector film can be made using organic or inorganic ligands with additional inorganic coating or infill materials, these detector films may exhibit the oxidation instability mentioned earlier. However, this instability is substantially reduced using low-temperature vapor deposition of an inorganic matrix. Such a process infills the pores of the quantum-dot solid films with the inorganic matrix. In the mean field approximation, the average dielectric constant of the medium around each quantum-dot, $\epsilon m$, can be estimated as the volume-weighted average of dielectric constants for the organic spacer and for the quantum-dot. With tighter packing, the mean dielectric constant increases due to the increasing volume fraction of inorganic particles. With infilling, the dielectric value is a volume-weighted average of the quantum-dots and the infill inorganic material. The infill material's dielectric causes a corresponding modification in electronic states within the quantum-dot, due to selective delocalization of the hole and electron orbitals. As a result, when choosing the quantum-dot size, matrix material dielectric properties must be considered. For example, if a wide bandgap metal oxide infill is used, the electron and hole orbitals can be confined by the wide bandgap infill material. If a narrow bandgap semiconductor infill is used, the electron and hole orbitals can be localized or delocalized based on the properties of the infill.

Either or both carriers can transport through the films tunneling dot-to-dot. If a semiconductor infill is used, electrical states aligned with the density of states of the valence or conduction bands of the quantum-dots, the hole or electron, respectively, can be injected into the infill material and can be transported through the infill semiconductor material Using the aforementioned processes a variety of composite photodetector can be manufactured such as pn and pin. In addition xBy devices can be made where x and y are either n-type of p-type materials and B is a barrier layer. where. The photodetector film can be tailored to provide local quantum-dot to quantum-dot distributed nano-hetereostructures can be made for efficient transport of one carrier, for example the minority carrier, through the inorganic matrix's higher conductivity pathways and allow the other carrier to transport by quantum-dot to quantum-dot hopping. The photodetectors can be single pixel or pixelated. The pixelated photodetectors can have pixel areas defined by electrode spacing or by dielectric barriers.

Figure 3:
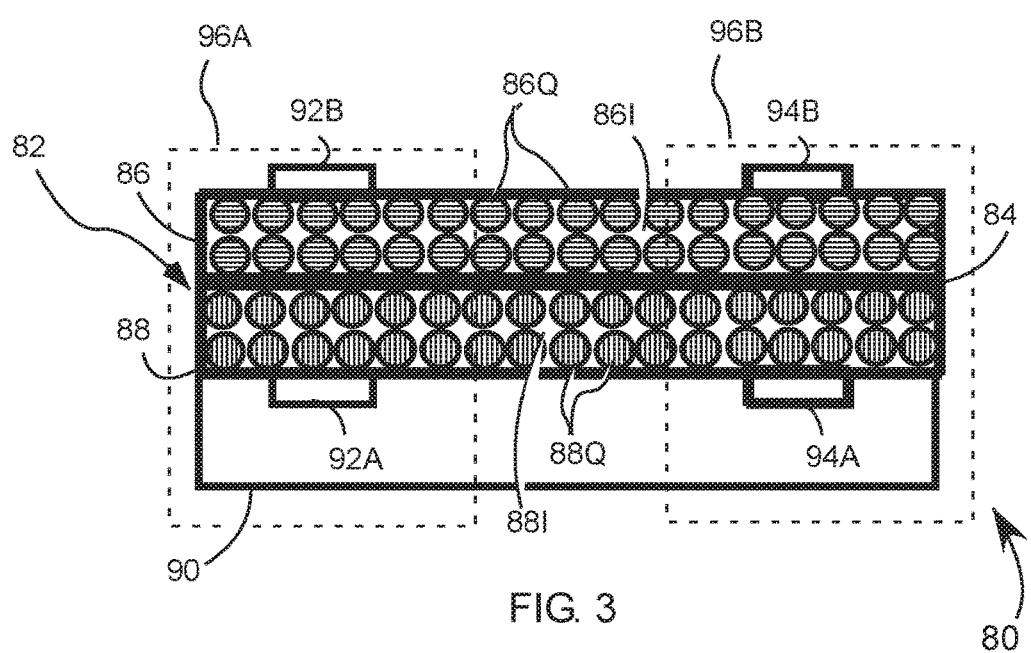
FIG. 3 is a cross-section view of a pn-junction composite quantum-dot photodetector.

Referring to FIG. 3, a photodetector device 80 has a photodetector film 82 with a pn-junction 84. Photodetector film 82 is comprised of a p-type film 86 and a n-type quantum-dot film 88. P-type film 86 is comprised of a quantum-dot 86Q within an inorganic matrix material 86I with a p-type quantum-dot composition. Photodetector film 88 is comprised of a quantum-dot 88Q within an inorganic matrix material 88I with an n-type quantum-dot composition. Photodetector film 82 was deposited on a substrate 90 with semiconductor quantum-dots and semiconductor infill material via the aforementioned processes. The photodetector film layers are shown for illustrative purposes only, the quantum-dot types can be different with each of the films and within the monolayers that the films comprise. Here, photodetector 80 is pixelated with a substrate 90 patterned with a readout integrated circuitry (ROIC) including a bottom electrode 92A and a bottom electrode 94A. An electrode 92B and an electrode 94B is deposited on the photodetector film define a photodetector pixel area 96A and 96B providing a pixelated circuit. Top electrode 92B and top electrode 94B can be a transparent conductive material or a metal deposited using evaporative or direct deposition processing including lithographic or inkjet printing techniques.

Figure 4A:
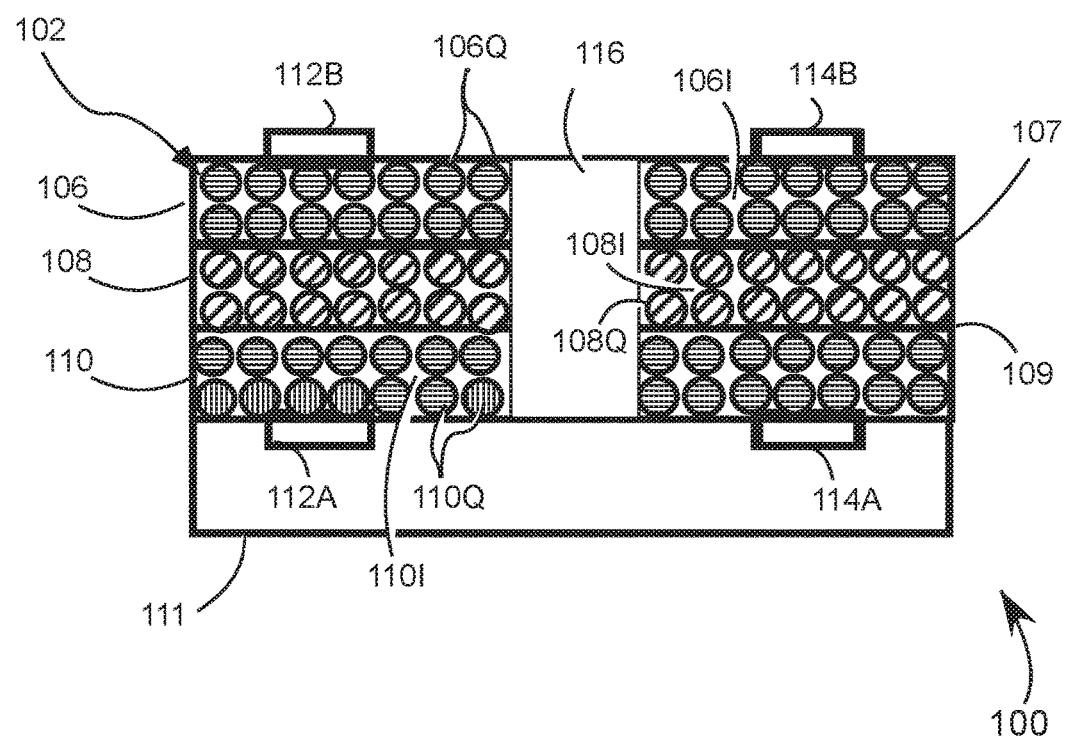
FIG. 4A is a cross-section view of a stacked composite quantum-dot photodetector.

Referring to FIG. 4A, a photodetector device 100 has a photodetector film 102 with an xBy configuration wherein x and y are n-type materials. A photodetector film 102 is comprised of a n-type layer 106 and an n-type layer 110 with a barrier layer 108 creating a nB junction 107 and 109. n-type layer 106 is comprised of a quantum-dot 106Q within an inorganic matrix material 106I with a n-type composition. A carrier blocking barrier layer 108 is comprised of a quantum-dot 108Q within an inorganic matrix material 108I configured to have a wide bandgap and act as a barrier for non-preferred carriers, for either blocking holes but not electrons, or blocking electrons but not holes. An n-type layer 110 is comprised of a quantum-dot 110Q within an inorganic matrix material 110I with a n-type composition Similar to that shown in FIG. 3, photodetector device 100 has a substrate 111 patterned with a readout integrated circuitry (ROIC) including a bottom electrode 112A, a bottom electrode 114A, a top electrode 11B and a top electrode 94B. Here pixel areas are defined by a dielectric barrier 116.

Figure 4B:
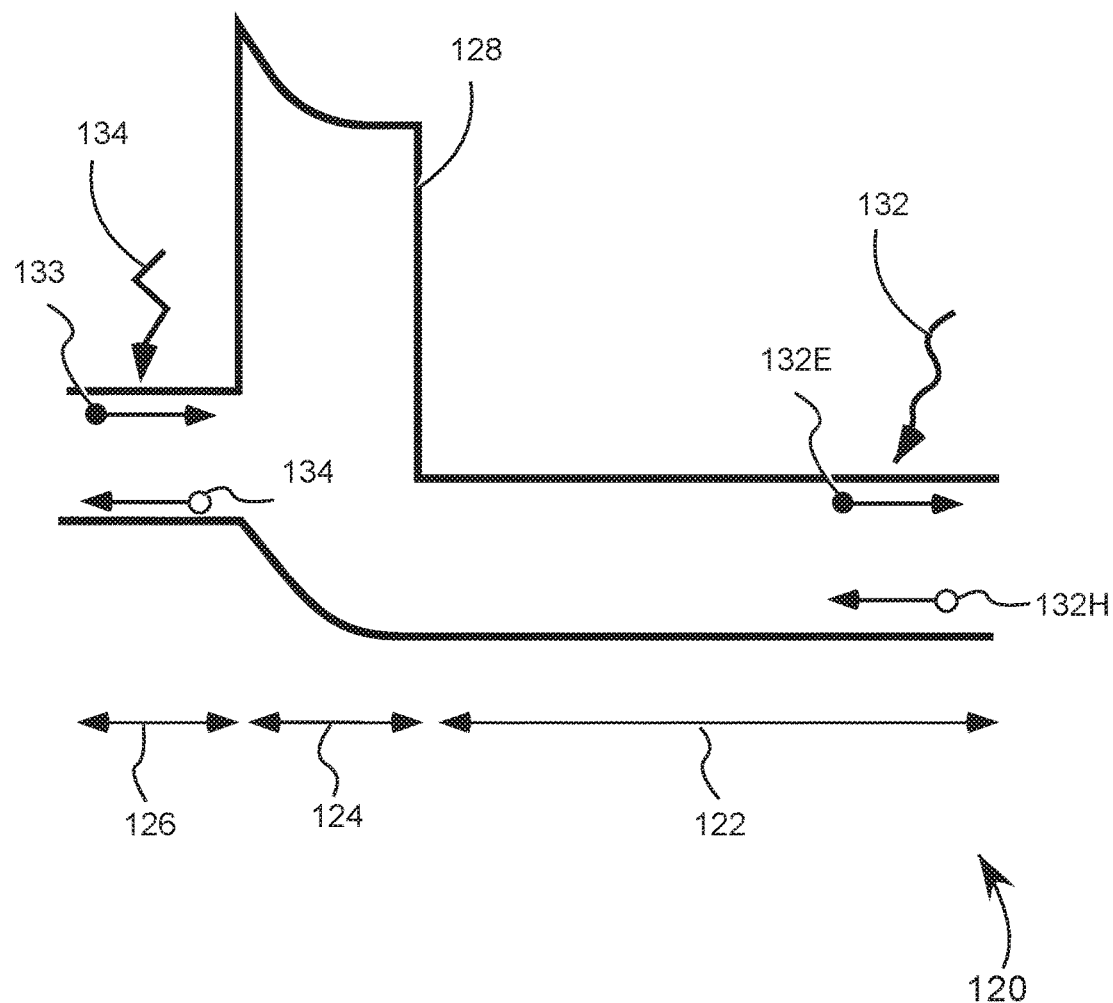
FIG. 4B is a graphical representation of a bandgap for a n-B-n structure.

FIG. 4B is a bandgap diagram 120 of the nBn device shown in FIG. 4A preferring hole carriers and blocking electrons. Bandgap diagram 120 has an n-type absorption region 122, a barrier region 124, and a n-type region corresponding to n-type film 106, barrier film 108, n-type film 110, respectively of the photodetector film of that shown in shown in FIG. 4A. Under biased operating conditions a photon 132P is absorbed in the absorption region 122 create an electron 132E and a hole 132H. Electron 132E and Hole 132H see little barrier resulting in photocurrent. A phonon 134 in n-type region 126 creates an electron 134E and a hole 134H. Here a barrier 128 prevents the electron from causing a photocurrent, promoting recombination and reducing phonon induced noise.

Figure 5A:
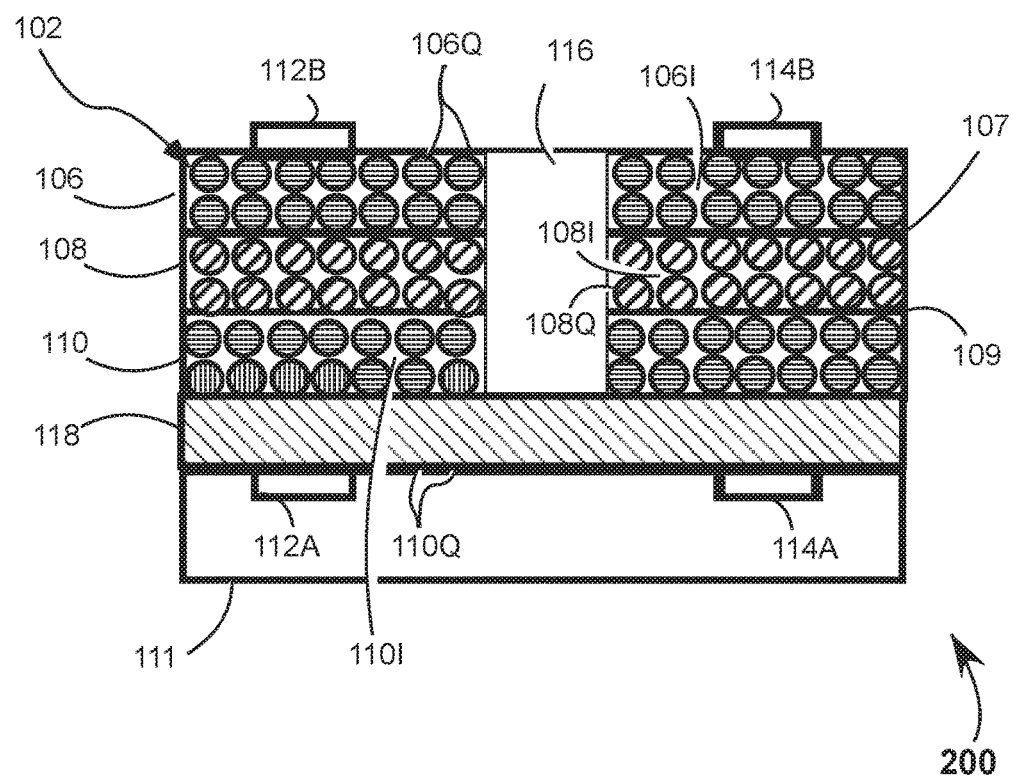
FIG. 5A is a cross-section view of an xBy type detector similar to that shown in FIG. 4A, further comprising another barrier layer.

Referring to FIG. 5A, a photodetector device 200 is a xBy type detector similar to that shown in FIG. 4A, further comprising another barrier layer 118. Barrier layer 118 is between the substrate 111 and n-type layer 110. Here, barrier layer 118 acts as a barrier for preferred carriers, preventing recombination.

Figure 5B:
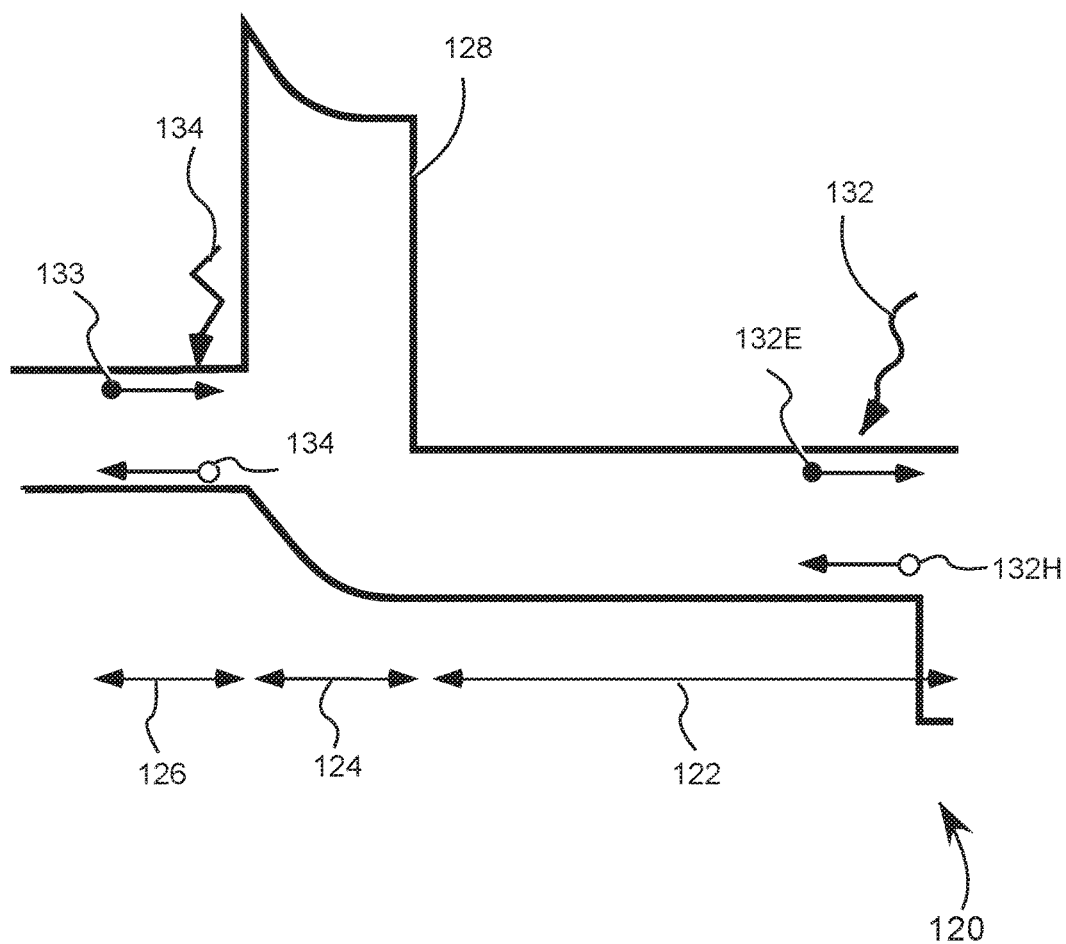
FIG. 5B is a graphical representation of a bandgap for the xBy type detector shown in FIG. 5A.

Referring to FIG. 5B a bandgap energy diagram 230 has that shown in FIG. 4B, further illustrating characteristics of the barrier layer 118. Here, barrier layer 118 brings the valence band to a lower energy level thereby acting as a hole blocking layer, blocking minority carrier injection.

Figure 6A:
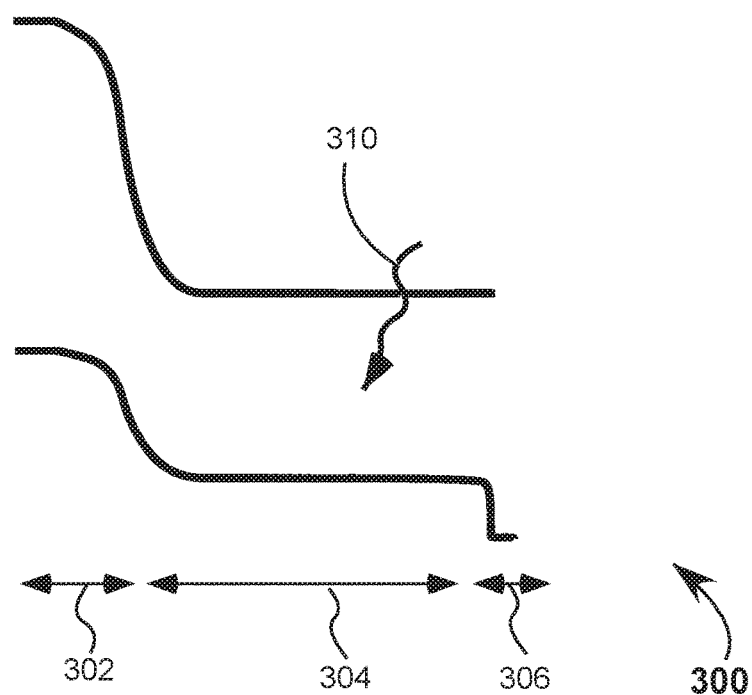
FIG. 6A is a graphical representation of a bandgap for a pn photodiode structure with an optional barrier layer.
Figure 6B:
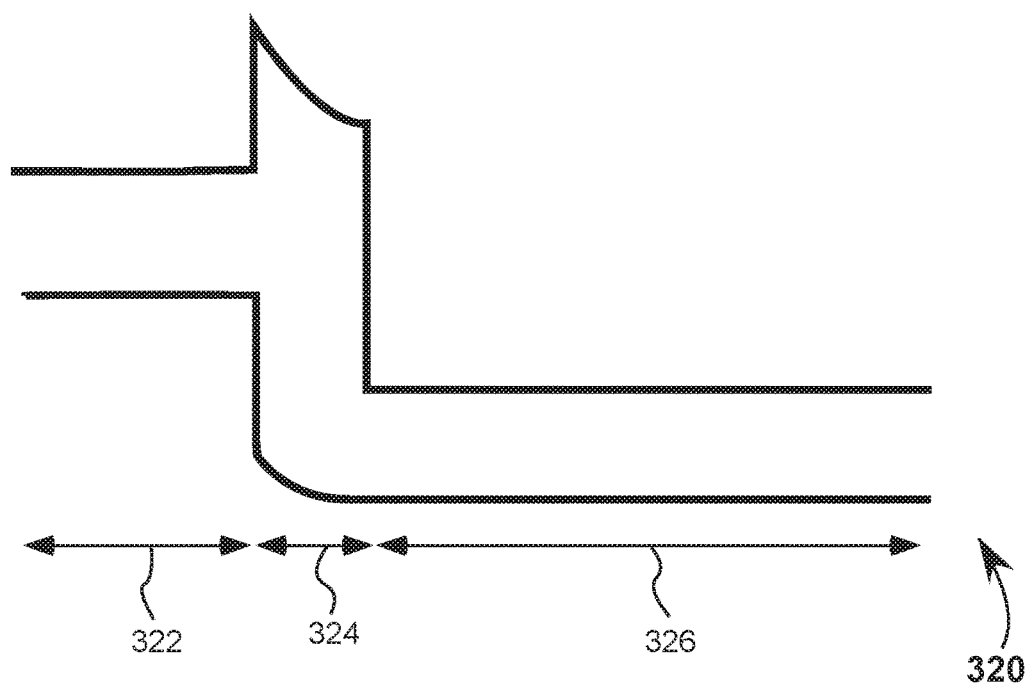
FIG. 6B is a graphical representation of a bandgap diagram of yet another xBy structure.
Figure 6C:
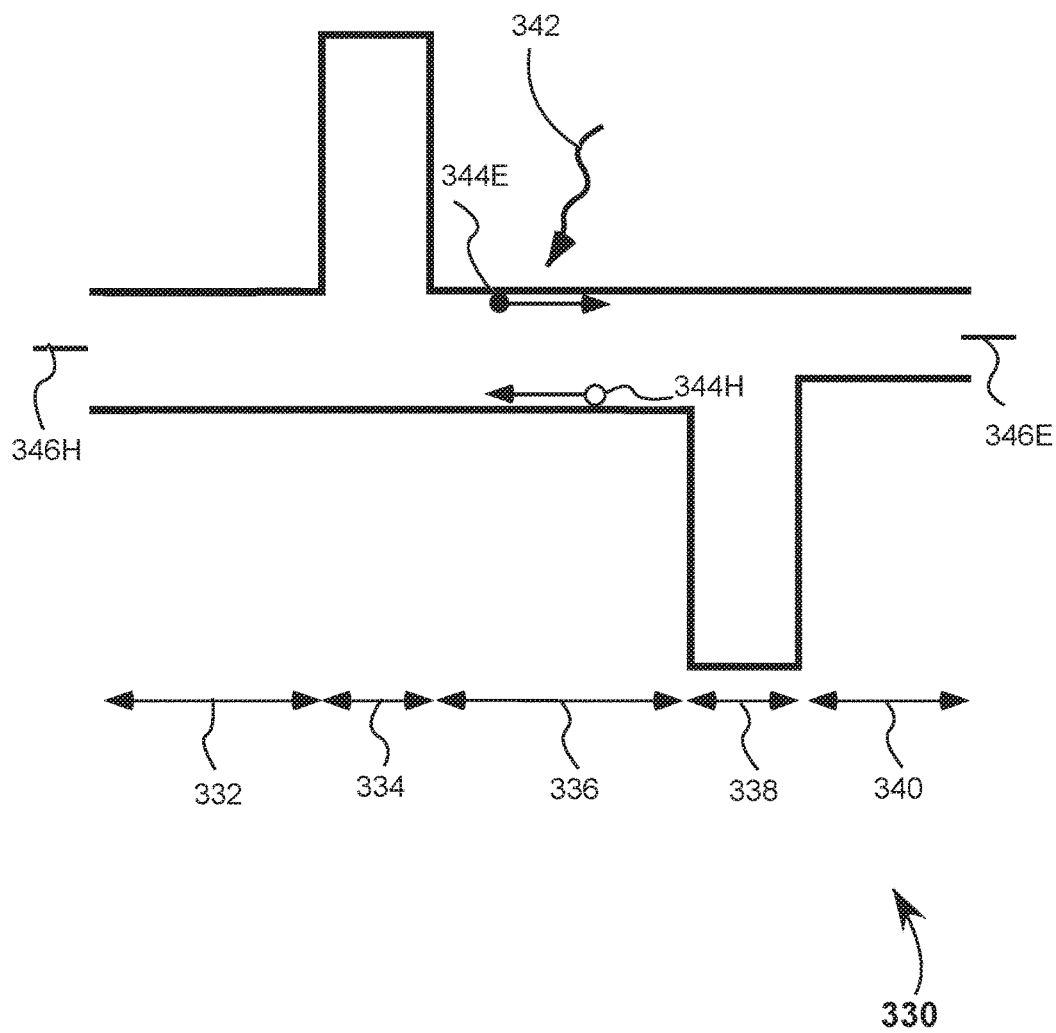
FIG. 6C is a graphical representation of a bandgap diagram of a photodetector device with a complementary barrier structure.
Figure 6D:
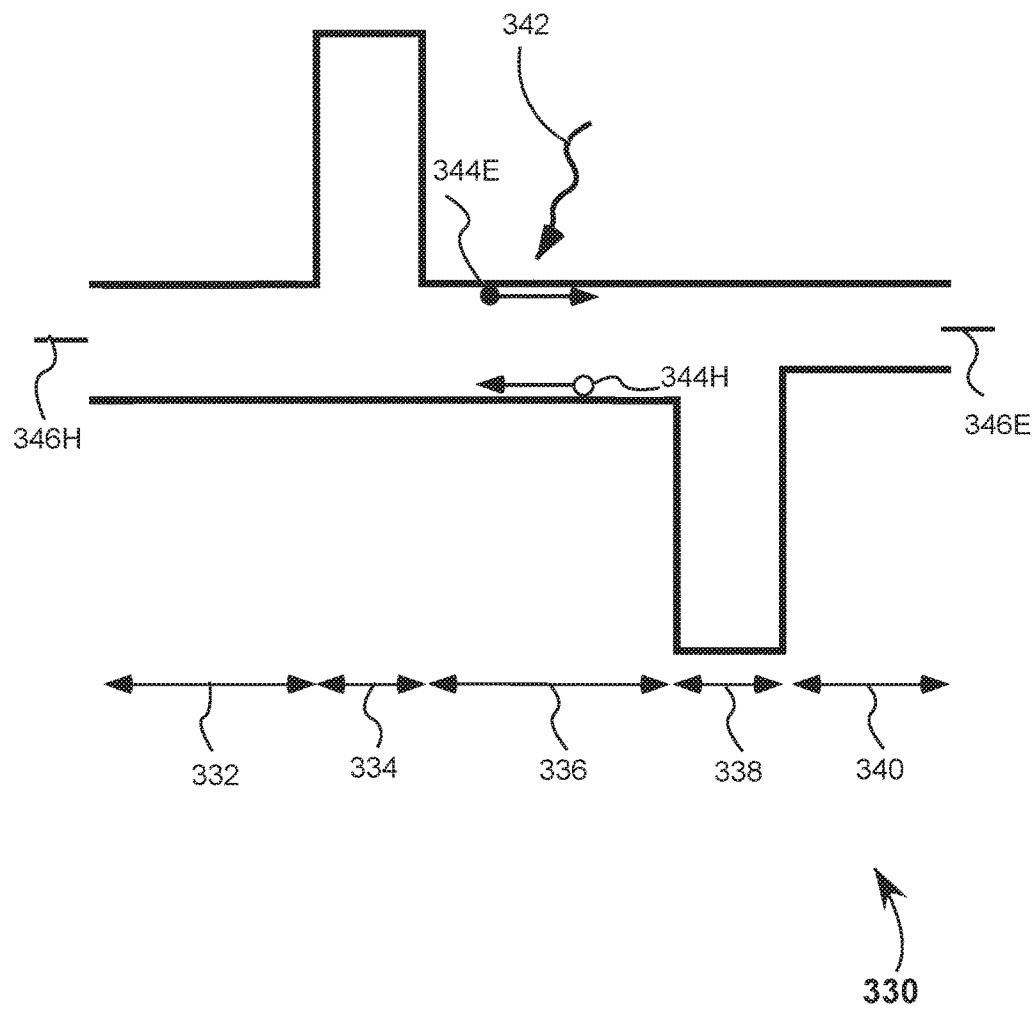

In addition to those structures provided, a variety of other heterostructure photodetectors can be produced from the colloidal processing methods. Referring to FIG. 6A a a pn photodiode structure with an optional barrier layer has a bandgap diagram 300. Bandgap diagram 300 has an p-type layer 302, an absorbing n-type layer 304, and an optional barrier layer 306. Optional barrier film 306 blocks minority current. Referring to FIG. 6B, another xBy type barrier device has a energy bandgap 320. Energy bandgap 320 graphically represents an x-layer 322, a barrier layer 324, and y-layer 326. Here the x-layer and the y-layer are different material types, wherein nanoparticle size, material, structure or combinations thereof area varied. Referring to FIG. 6C, a bandgap diagram 330 represents a photodetector device with a complementary barrier structure. Bandgap Diagram 330 has a first contact layer 332, an electron barrier 334, an absorbing layer 336, a hole barrier 338, and a second contact layer 340. In operation, a photon 342 is absorbed in absorbing layer 336 and creates an electron-hole pair. An electron 344E is block by electron barrier 334 and current is directed to an electron contact collector 346. Likewise, a hole 344H is blocked by hole barrier 338 and is directed to a hole contact collector 346H.

From the description provided herein one skilled in the art can manufacture the apparatus and practice the methods disclosed in accordance with the present disclosure. In summary, while the present invention has been described in terms of particular embodiments and examples, others can be implemented without departing in scope. The invention is not limited to the embodiments described and depicted herein. Rather, the invention is limited only by the claims appended hereto.

What is claimed is:

1. A composite quantum-dot photodetector comprising:
A substrate with a colloidally deposited thin film structure forming a photosensitive region, the thin film containing a plurality of at least one type of a nanocrystal quantum-dot, whereby the nanocrystal quantum dots are spaced by ligands to form a lattice; and
the lattice of the quantum dots has an infill material that forms an inorganic matrix that isolates the nanocrystal quantum dots from atmospheric exposure.

2. The photodetector of claim 1 wherein the nanocrystal quantum-dot is made from materials InSb, InGaP, PbS, PbSe, PbTe, $PbI_2$, HgS, HgTe, $LaF_3$, CdS, $CuInS_2$, CdTe, $CuZnInS_2$, CdSe, $HfO_2$, CIS, CZTS, $YV(B)O_4$, ZnS, $ZrO_2$, PbSxSe1-x, HgxCd1-xTe, InAs(1-x)Sb(x), Al(x)Ga(1-x)As or combinations thereof.

3. The photodetector of claim 1 wherein the nanocrystal quantum dots are composed of a ternary material with radially gradient alloy composition.

4. The photodetector of claim 1, wherein the substrate is a CMOS wafer containing electrical circuits for biasing or amplifying the signal from the photodetector, the CMOS wafer being planar with a surface that is within 1 μm peak-to-peak flatness per centimeter.

5. The photodetector of claim 1 wherein the photodetector is a pixelated array.

6. The photodetector of claim 1, wherein the photodetector is a xBy structure wherein x and y are either an n-type or a p-type material and B a first barrier layer.

7. The photodetector of claim 6 wherein the photodetector further comprising a second barrier layer C, wherein the second barrier layer is on either side of the xBy thin film to prevent conduction of a charge carrier.

8. The photodetector of claim 7 wherein the second barrier layer is a hole blocking barrier.

9. The photodetector of claim 7, wherein the second barrier layer is an electron blocking barrier.

10. The photodetector of claim 6, wherein the composition of the x material is different than the y material.

11. The photodetector of claim 1, wherein the nanocrystal quantum-dot has a core and a shell, the core of the quantum-dot being an alloy containing more than two atomic elements.

12. The photodetector of claim 11, wherein the nanocrystal quantum-dot is p-type.

13. The photodetector of claim 11, wherein the nanocrystal quantum-dot is n-type.

14. The photodetector of claim 11, wherein the nanocrystal quantum-dot is doped to be p-type.

15. The photodetector of claim 11, wherein the nanocrystal quantum- is doped to be n-type.

16. The photodetector of claim 11, wherein the surface composition of the nanocrystal quantum-dot is used to create dipoles that cause the nanocrystal quantum-dot to be p-type.

17. The photodetector of claim 11, wherein the surface composition of the quantum-dot creates dipoles that cause the nanocrystal quantum-dot to be n-type.

18. The photodetector of claim 1, wherein infill material forms a potential barrier to one or both the holes and electron carriers in the detector layer.

19. The photodetector of claim 1, wherein the composition of the infill semiconductor material with a band alignment promote extraction of one, but not both charge carriers.

20. The photodetector of claim 1, wherein transport of one type of carrier is conducted between the nanocrystal quantum-dots, and transport of the other carrier is conducted through an inorganic infill semiconductor material.

21. The photodetector of claim 1, wherein an electric contact to the thin film structure is transparent to optical radiation.

22. The photodetector of claim 1, wherein the inorganic matrix comprises of insulating $Al_2O_3$, $ZrO_2$, $HfO_2$, or combinations thereof.

23. The photodetector of claim 1, wherein the inorganic matrix comprises of Halometallate Perovskite.

24. The photodetector of claim 1, wherein the inorganic matrix comprises of a pnictide semiconductor.

25. The photodetector of claim 1, wherein the inorganic matrix comprises an organic semiconductor.

26. The photodetector of claim 1, wherein the inorganic matrix is comprised of Ag2S.

27. The photodetector of claim 1, further comprising a first barrier layer to block either holes or electrons.

28. The photodetector of claim 27, further comprising a second barrier layer, the second barrier layer blocking the opposite carrier the first barrier blocks.

29. The photodetector of claim 27, wherein one or more of the nanocomposite layers includes a graded bandgap.

30. The photodetector of claim 27, wherein absorption of optical radiation in the detection layer is achieved through intraband transitions.

31. The photodetector of claim 1, further comprising a transparent electrical contact.

32. The photodetector of claim 31, wherein the transparent contact is composed of a metal oxide.

33. The photodetector of claim 31, wherein the transparent electrical contact includes metal nanoparticles.

* * * * *